United States Patent [19]

Bennett et al.

[11] Patent Number: 5,049,767

[45] Date of Patent: Sep. 17, 1991

[54] SHARED INVERTER OUTPUTS DELAY SYSTEM

[75] Inventors: Robert M. Bennett, Canton, Mich.; Scott L. Falater, Phoenix, Ariz.

[73] Assignee: Honeywell Inc., Minneapolis, Minn.

[21] Appl. No.: 345,926

[22] Filed: May 1, 1989

[51] Int. Cl.⁵ ..................... H03K 5/13; H03K 19/091
[52] U.S. Cl. .................................. 307/605; 307/459; 307/477; 307/595; 307/597; 307/602; 307/603; 307/299.3
[58] Field of Search ............... 307/605, 459, 477, 591, 307/595, 596, 597, 602, 603, 310, 299.3, 606

[56] References Cited

U.S. PATENT DOCUMENTS

| | | | |
|---|---|---|---|
| 3,248,657 | 4/1966 | Turecki | 328/55 |
| 3,553,484 | 1/1971 | Gassmann | 307/141 |
| 3,906,212 | 9/1975 | Poguntke | 307/455 |
| 3,989,957 | 11/1976 | Tuccu | 307/477 |
| 4,016,511 | 4/1977 | Ramsey et al. | 333/29 |
| 4,327,391 | 4/1982 | Grzebielski | 361/31 |
| 4,341,960 | 7/1982 | Naiff | 307/459 |
| 4,423,459 | 12/1983 | Stich et al. | 361/94 |
| 4,438,353 | 3/1984 | Sano et al. | 307/477 |
| 4,441,198 | 4/1984 | Shibata et al. | 377/72 |
| 4,484,091 | 11/1984 | Nagano | 307/459 |
| 4,489,247 | 12/1984 | Ikeda et al. | 307/477 |
| 4,531,065 | 7/1985 | Nakayama et al. | 307/200 |
| 4,641,046 | 2/1987 | Becker et al. | 307/448 |
| 4,652,778 | 3/1987 | Hosoya et al. | 307/605 |
| 4,700,089 | 10/1987 | Fujii et al. | 307/605 |
| 4,831,286 | 5/1989 | Garcia et al. | 307/606 |
| 4,841,484 | 6/1989 | Watanabe et al. | 307/477 |

FOREIGN PATENT DOCUMENTS

| | | | |
|---|---|---|---|
| 0000763 | 1/1985 | Japan | 307/477 |
| 0023614 | 1/1987 | Japan | 307/603 |

OTHER PUBLICATIONS

Taub & Schilling, "Digital Integrated Circuits"; 1977; pp. 10-27 and 164-175.

"The Effect of Base Contact Position on the Relative Propagation Delays of the Multiple Outputs of an I²L Gate," Kerns, Jr., *IEEE Journal of Solid-State Circuits*, Oct. 1976, vol. SC-11, Number 5, pp. 712-717.

*Semiconductor Devices and Integrated Electronics*, A. G. Milnes, D.Sc. Van Nostrand Reinhold Company, 1980, pp. 246-250.

*Analysis and Design of Digital Integrated Circuits*, Hodges and Jackson, McGraw-Hill Book Company, 1983, pp. 199-204.

*Primary Examiner*—Stanley D. Miller
*Assistant Examiner*—Terry D. Cunningham
*Attorney, Agent, or Firm*—Theodore F. Neils; Gregory A. Bruns

[57] ABSTRACT

A delay timer formed by a sequence of inverters alternating in type, some with single and some with multiple outputs each having an output connected to the input of the next. An output from each of the multiple output inverters is connected to the timer output.

12 Claims, 2 Drawing Sheets

SHARED INVERTER OUTPUTS DELAY SYSTEM

BACKGROUND OF THE INVENTION

1. Field of the Invention

The present invention relates to logic level propagation delay systems, and more particularly, delay systems which avoid spurious signals at an output thereof prior to the full propagation of a logic level to the output.

2. Description of the Prior Art

Digital systems of many kinds are in increasing use. This situation is occurring because of the decrease in cost and because of the increase in performance due to improvements in monolithic integrated circuit technology. Further increases in the use of such digital systems is therefore assured even though many uses continue for analog systems and subsystems.

In such digital systems, and in analog systems, there is often a need for a delay in time between the occurrence of one event indicated by a signal and the start of some other event, or at least during some acknowledgment of the occurrence of the first event. In these situations, and other delay situations, a delay arrangement of some kind must be provided in such a system.

Various kinds of delay systems have been used in the past. For instance, an analog delay system has been used in which a logic level or signal is delayed in time by the amount of time such a signal takes to propagate along a discrete delay line. Currently, however, many delay systems must be amenable to inclusion in a monolithic integrated circuit chip for convenience, cost and performance reasons. Today's systems meeting this requirement have delays provided therein often based on either the time taken by a current source to linearly charge a capacitor in an analog approach, or by the time taken to count a number of pulses provided by a timing, or clocking, circuit in a digital implementation.

The former method, depending on capacitors and current sources, has the disadvantage of often requiring a relatively large amount of space in an integrated circuit chip, and the further disadvantage of needing accurate, or accurately compensable, comparators, current sources, and capacitors obtainable only through fabrication processes which exhibit variations and which must operate in a system that maintains accuracy over a substantial temperature range. The latter scheme of counting clock pulses requires the availability of a sufficiently accurate source of such clocking pulses. Thus, a desirable delay system without resort to large capacitors, accurate components or an accurate source of clock pulses is desired.

SUMMARY OF THE INVENTION

The present invention provides a sequence of inverters alternating in type between ones having an input and at least two outputs and ones having an input and at least one output, an output of one kind being electrically connected to the input of the other kind. Remaining outputs of those inverters having at least two outputs are electrically connected to the system output. The input of one of the inverters serves as the system input. A suitable implementation for such inverters is provided by use of an integrated injection logic gate therefor, the current injection input of such logic gates being usable to control the amount of switching delay therein.

DETAILED DESCRIPTION OF THE PREFERRED EMBODIMENTS

Figure 1:
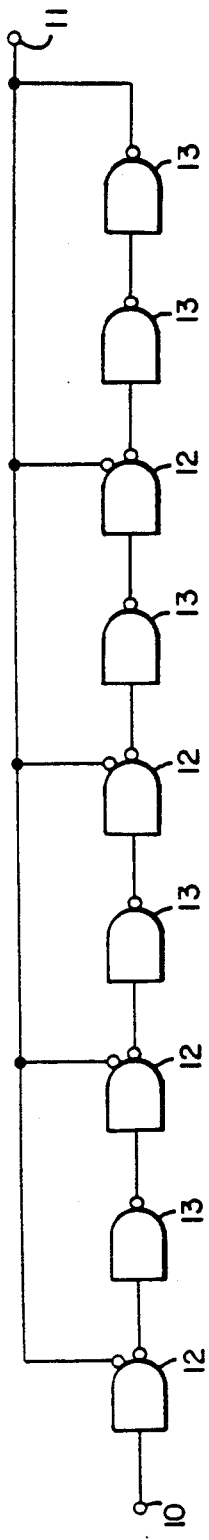
FIG. 1 shows a logic gate diagram version of the present invention.

FIG. 1 shows a delay system having a delay system input, 10, and a delay system output, Between input 10 and output 11 are provided a sequence of logic gates alternating in type such that there are two pluralities of logic gates. One plurality, with members thereof designated 12, comprises single input and double output NAND gates, and the other plurality, with members thereof designated 13, comprises single input and single output NAND gates. NAND logic gates, having a single input, provide the logic function of an inverter. Multiple output logic gates 12 have the same output voltage level state, i.e. logic state, occurring at each output for a given input voltage level state or logic state.

Each of these NAND gates, as an inverter, takes one of two logic states at its output, and is in the opposite logic state opposite the one occurring at its input which can also be one of two states. Thus, electrical signals at an input of one of logic gates 12 or 13 which are of a value above a threshold value will assure that the output of that logic gate is in the lower voltage value output state. In the opposite situation, input signals at an input of a logic gate 12 or 13 which are of a value below another threshold lead to the output of that logic gate being in the higher voltage value output state. If the input signals should switch from a magnitude which is above the first threshold mentioned to the opposite one, or vice versa, the output states for the logic gate will also switch to a logic state opposite the one in which it was in, though after some switching delay.

In operation, if the signal at system input 10 has, for instance, been of a value above a threshold value for the first logic gate 12, the output of logic gate 12 will be in a low logic state as indicated above. As a result, the input of the succeeding logic gate 13 is in the input low logic state and so its output will be in the high logic state. This, in turn, at the input of the next logic gate 12, causes the output of that next gate 12 to be in the output low logic state, and so alternating output logic states occur along the sequence of inverters shown in FIG. 1. Since there is an odd number of logic gates shown in FIG. 1, system input 10 being in a high logic state initially leads to system output 11 being in a low logic state. Each of the logic gate outputs connected to system output 11 is in the low logic state.

A change in the logic state at system input 10 from the initial high logic state exceeding a threshold of the first gate 12 to a low logic state below another threshold of logic gate 12 leads to propagating logic state changes along the inverter sequence of FIG. 1. The first logic gate 12 output, as a result, goes to the high logic state causing the output of the succeeding logic gate 13 to go to the low logic state. This, in turn, causes the output state of the next logic gate 12 to rise to the high logic state and so on along the inverter sequence.

As can be seen from the foregoing description, all of logic gates 12 have the outputs thereof in a high logic state together or in a low logic state together after all logic state changes have completely propagated along the inverter sequence. This is also true of all of the logic gates 13 except for the last one connected to output 11 which instead has its output behave as the output of a logic gate 12. This is because an output is not required in this last logic gate 13 to provide an output to drive a subsequent logic gate. Of course, a multiple output logic gate could just as well be used in place of this right hand logic gate 13, leaving the extra outputs unconnected in the delay system.

The second output on each of gates 12, and the output of the far right hand gate 13, are all connected in common to the system output 11. As a result, these outputs together perform a wired-AND function. That is, output 11 cannot rise from a low logic state to a high logic state if system input 10 goes from a high logic state to a low logic state until each of the logic gates connected to system output 11 go to a high logic state. Hence, system output 11 could not rise to a high logic state until each of the logic level changes occurring at the successive gate outputs, due to the downward change in logic values of system input 10, have propagated along the inverter sequence and reached the last logic gate 13 on the right. This, of course, assumes that any remaining logic gates connected to output 11 still having a low logic level at outputs thereof will be able to dominate those gates connected to output 11 already directed to provide a high logic state at outputs thereof.

Because of this result, the downward change in logic state at system input 10 will not result in a change at system output 11 for a time duration which depends on a combination of the switching delays occurring in each of the logic gates 12 and 13 along the inverter sequence of FIG. 1. Furthermore, any kind of a spurious disturbance at system input 10 or at some gate along this inverter sequence of a duration less than the propagation delay between system input 10 and output 11 cannot lead to a pulse occurring on system output 11. This is because each logic gate along the inverter sequence having an output thereof connected to system output 11, and which has not yet changed output states in response to a logic state change in the delay system, acts to hold system output 11 in a low logic state. A spurious logic state change at system input 10 or somewhere along the inverter sequence of a duration less than the system propagation delay always leaves some logic gate holding system output 11 in the low logic state. Hence, spurious signals do not occur on system output 11 indicating falsely that an intended high-to-low state change has occurred at system input 10.

The arrangement of FIG. 1 allows system propagation delays to be chosen in duration through allowing a choice in the number of gates 12 and 13 to be alternately placed in the inverter sequence between system input 10 and system output 11. A further possibility for controlling the system propagation delay would follow if the switching delay from the input to the output of some or each of gates 12 and 13 in the inverter sequence could be controlled or adjusted in duration. A very convenient kind of logic gate for accomplishing this is provided by the logic gates in the integrated injection logic family, or I$^2$L family. Such a sequence of logic gates, each acting as an inverter, is shown in FIG. 2.

Figure 2:
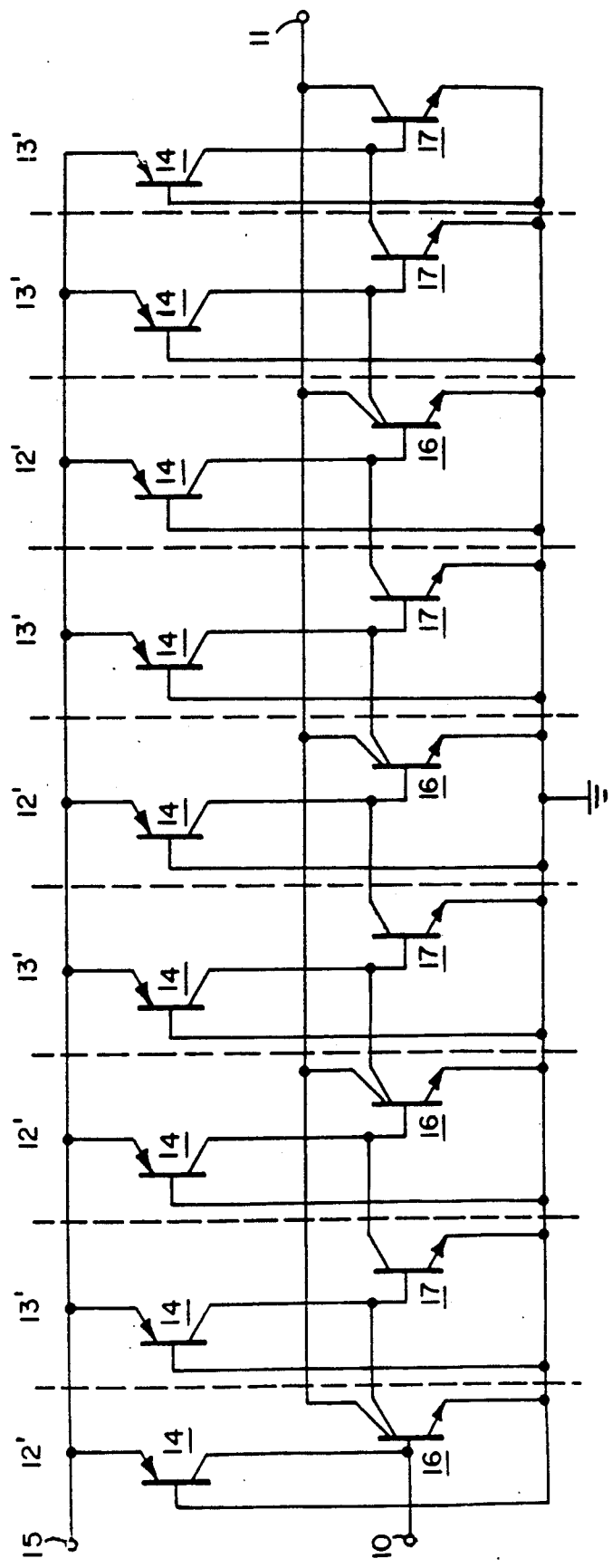
FIG. 2 shows a circuit schematic diagram version of the present invention.

The inverter circuit stages, or logic gate circuits, of FIG. 2 are set apart by vertical dashed lines and are designated as 12' for a gate with double collector outputs and 13' for a gate with a single collector output.

The prime designations are used because I$^2$L gates are not precisely NAND gates or NOR gates, although systems of I$^2$L logic can be viewed as equivalently a NAND or NOR logic gate system. Input terminal 10 and output terminal 11 in FIG. 2 again represent the delay system input and output as they did in the system of FIG. 1.

Each of logic gates 12' has a pnp bipolar junction transistor, 14, with its emitter serving as the current injection input to that logic gate. In FIG. 2, all of the current injection inputs for each of the logic gates there are connected together and to a terminal means, 15, serving as the common current injection input for the delay system of FIG. 2. Each of logic gates 12' is shown having a multiple collector npn bipolar junction transistor, 16, serving as the inverting transistor for the gate. The base of each transistor 16 is the gate logic input, and its collectors are the gate logic outputs. Each of logic gates 13' is shown with an npn bipolar junction transistor, 17, having a single collector as the inverting transistor for the gate. The base of each transistor 17 is the gate logic input, and its collector is the gate logic output.

There is no particular reason that the only inverting npn bipolar transistors shown have either one or two collectors other than that it is what would normally be done in this delay system to save space in the integrated circuit chip. However, any of transistors 16 or 17 could be made with more collectors than are shown in the integrated circuit chip if further signals from such a transistor were needed in the digital system using this integrated circuit chip. A collector of a transistor 16 or 17 as an output for a logic gate circuit 12' or 13', respectively, is electrically connected to the input base of the opposite kind of inverting transistor in the opposite kind of gate to again form an inverter sequence. Second outputs of transistors 16 and the output of the last of transistors 17 are connected to system output 11.

This circuit of FIG. 2 showing interconnected, individual gate circuits operates exactly in the manner described for the logic gate system of FIG. 1 with successive gate circuit outputs having alternating logic states. The only difference is the joint availability of the current injection inputs for each of current injection transistors 14 at system injection current input 15. The switching delay of an I$^2$L gate between the occurrence of a state change at the input and a corresponding state change occurring at the output depends on a) the amount of current applied at the gate current injection input, b) the parasitic capacitances occurring in the semiconductor structure, and c) the charge storage time in the base of the inverter transistor. Therefore, the switching delay in an I$^2$L gate can be externally controlled during use to a significant extent by the amount of current provided at the current injection input.

However, the structural parasitic capacitances and the charge storage time of the inverting transistor base are primarily controlled by the integrated circuit chip fabrication methods and the geometrical structure therein of the gate devices. For small injected currents, the parasitic capacitances are likely to control the switching delay, but an increase in injected current at some point leads to the charge storage time as being the limiting factor in the switching delay.

Figure 3:
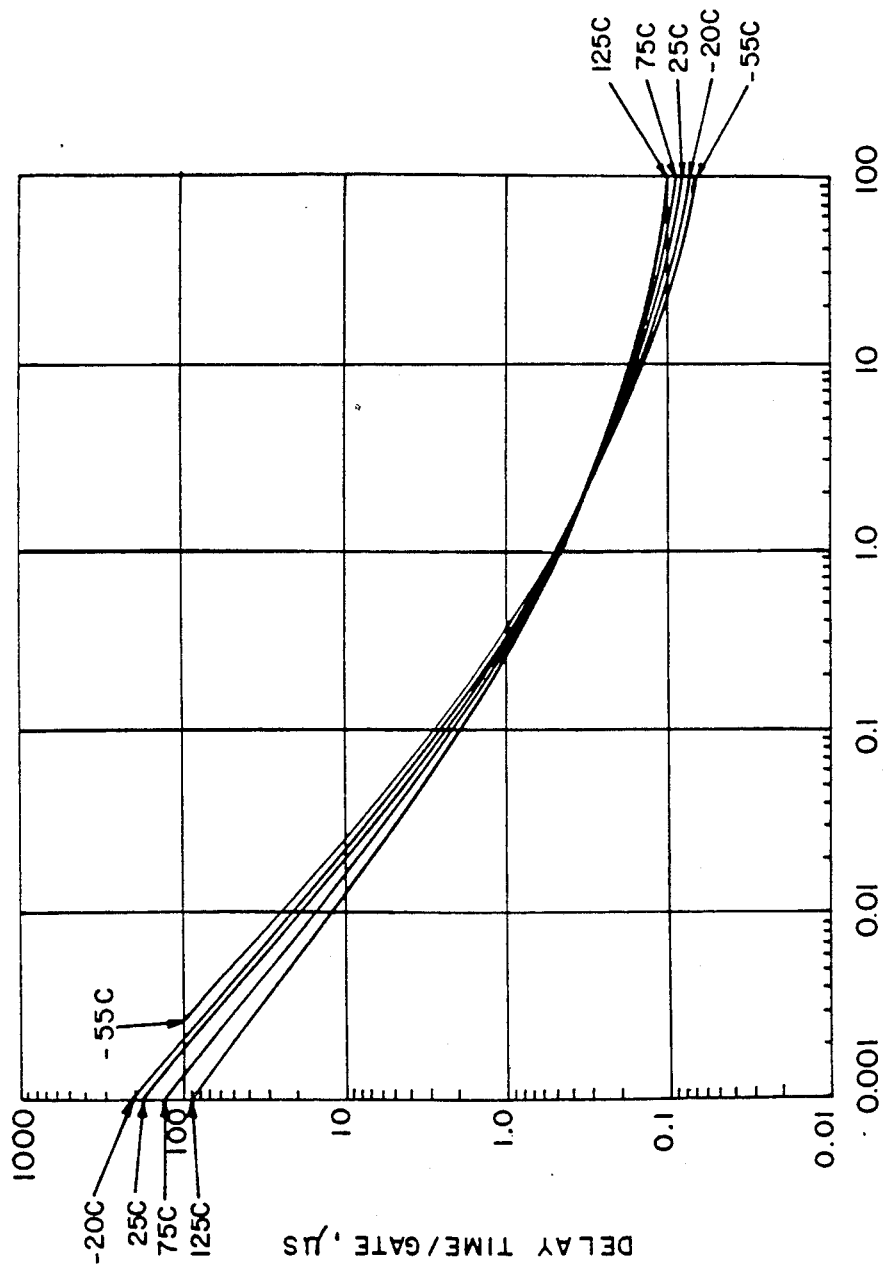
FIG. 3 shows a graph indicating the performance of circuits shown in FIG. 2.

FIG. 3 shows the result of calculating the average delay time per gate for various average injector currents per gate in a ring counter having ten I$^2$L gates over various temperatures. As can be seen, there is a point near 1.0 μA of average gate injection current for gates of one suitable construction at which the temperature has no effect on the resultant delays and so the delay time is independent of temperature. Operating at this point can be used to advantage in generating a stable time delay for a delay system of the kind described here, constructed of such I²L gates, which is capable of operating over an extended temperature range.

Although the present invention has been described with reference to preferred embodiments, workers skilled in the art will recognize that changes may be made in form and detail without departing from the spirit and scope of the invention.

What is claimed is:

1. A logic level propagation delay system having an input and an output, said system comprising:

a plurality of multiple output signal level inverters, including first and second multiple output signal level inverters, each said multiple output signal level inverter having a first input and first and second outputs such that each said multiple output signal level inverter, if electrically energized, has its first and second outputs at one logic state voltage level if input signals of a magnitude range less than a first threshold value are applied to its first input and at an opposite logic state voltage level if such input signals are of a magnitude ragne exceeding a second threshold value with a change in magnitude in such input signals between said magnitude ranges leading to a corresponding change in logic state voltage levels at said first and second outputs thereof but which occurs only after first and second switching delays following such a change in magnitude in said input signals, respectively;

a set of intermediate signal level inverters having at least a first intermediate signal level inverter therein, each of said intermediate signal level inverters having a first input and an output such that each said intermediate signal level inverter, if electrically energized, has its output at one logic state voltage level if input signals of a magnitude range less than a third threshold value are applied to its first input and at an opposite logic state voltage value if such input signals are of a magnitude range exceeding a fourth threshold value with a change in magnitude in such input signals between said magnitude ranges leading to a corresponding change in logic state voltage levels at said output thereof but which occurs only after an intermediate switching delay following such a change in magnitude in said input signals; and an inverter sequence comprising said first and second multiple output signal level inverters and said first intermediate signal level inverter, said first multiple output signal level inverter first input serving as said system input with any of said outputs thereof electrically connected to said second multiple output signal level inverter first input being so connected solely through said first intermediate signal level inverter, said first multiple output signal level inverter first output being electrically connected to said first intermediate signal level inverter first input which is free of any direct connection from any of said outputs of said second multiple output signal level inverter, said first intermediate signal level inverter output being electrically connected to said second multiple output signal level inverter first input and said first multiple output signal level inverter second output and said second multiple output signal level inverter second output each being electrically connected to said system output.

2. The apparatus of claim 1 wherein said inverter sequence is further comprised of alternating ones of said plurality of multiple output signal level inverters and said plurality of intermediate signal level inverters, including said first and second multiple output signal lever inverters and said first intermediate signal level inverter, such that outputs of said intermediate signal level inverters in said inverter sequence are electrically connected to first inputs of said multiple output signal level inverters, and first outputs of said multiple output signal level inverters in said inverter sequence are electrically connected to first inputs of said intermediate signal level inverters, said multiple output signal level inverters second outputs in said inverter sequence each being electrically connected to said system output.

3. The apparatus of claim 1 wherien there is further provided, for each of said multiple output signal level inverters in said plurality thereof in said inverter sequence, and for each of said intermediate signal level inverters in said set thereof in said inverter sequence, a second input with each of said multiple output signal level inverters in said plurality thereof having its first and second switching delays adjustable in duration through adjusting electrical conditions at its said second input and with said intermediate switching delays of each of said intermediate signal level inverters being adjustable in duration through adjusting electrical conditions at its said second input.

4. The apparatus of claim 1 wherein each of said first and second multiple output signal level inverters each comprise an integrated injection logic gate having a logic input serving as said first input thereof, and having two logic outputs serving as said first and second outputs thereof, and wherein said first intermediate signal level inverter comprises an integrated injection logic gate having a logic input serving as said first input thereof and having a logic output serving as said output thereof.

5. The apparatus of claim 2 wherein there is further provided, for each of said multiple output signal level inverters in said set thereof in said inverter sequence and for each of said intermedaite signal level inverters in said plurality thereof in said inverter sequence, a second input with each of said multple output signal level inverters in said plurality thereof having its first and second switching delays adjustable in duration through adjusting electrical conditions at its said second input and with each of said intermediate signal level inverters in said set thereof having its intermediate switching delay adjustable in duration through adjusting electrical conditions at its said second input.

6. The apparatus of claim 2 wherein each of said plurality of multiple output signal level inverters comprises an integrated injection logic gate having a logic input serving as said first input thereof, and having two logic outputs serving as said first and second outputs thereof, and wherein each of said set of intermediate signal level inverters comprises an integrated injection logic gate having a logic input serving as said first input thereof, and having a logic output serving as said output.

7. The apparatus of claim 3 wherein each of said first and second multiple output signal level inverters comprises an integrated injection logic gate having a logic input serving as said first input thereof, having a current injection input serving as said second input thereof, and having two logic outputs serving as said first and second outputs thereof, and wherein said first intermediate signal level inverter comprises an integrated injection logic gate having a logic input serving as said first input thereof, having a current injection input serving as said second input thereof, and having a logic output serving as said output thereof.

8. The apparatus of claim 4 wherein each of said integrated injection logic gates serving as one of said first and second multiple output signal level inverters is so constructed that a current value can be selected for current applied to a current injection input thereof such that its said first and second switching delays will be independent of temperatures at which such integrated injection logic gate is operated, and wherein said integrated injection logic gate serving as said first intermediate signal level inverter is so constructed that a current value can be selected for current applied to a current injection input thereof such that its said intermediate switching delay will be independent of temperatures at which such integrated injection logic gate is operated.

9. The apparatus of claim 5 wherein each of said plurality of multiple output signal level inverters comprises an integrated injection logic gate having a logic input serving as said first input thereof, having a current injection input serving as said second input thereof, and having two logic outputs serving as said first and second outputs thereof, and wherein each of said set of intermediate signal level inverters comprises an integrated injection logic gate having a logic input serving as said first input thereof, having a current injection input serving as said second input thereof, and having a logic output thereof serving as said output thereof.

10. The apparatus of claim 6 wherein each of said integrated injection logic gates serving as one of said plurality of multiple output signal level inverters is so constructed that a current value can be selected for current applied to a current injection input thereof such that its said first and second switching delays will be independent of temperatures at which such integrated injection logic gate is operated, and wherein each said integrated injection logic gate serving as one of said set of intermediate signal level inverters is so constructed that a current value can be selected for current applied to a current injection input thereof such that its said intermediate switching delay will be independent of temperatures at which such integrated injection logic cate is operated.

11. The apparatus of claim 7 wherien each of said integreated injection logic gates serving as one of said first and second multiple output signal level inverters is so constructed that a current value can be selected for current applied to a current injection input thereof such that its said first and second switching delays will be independent of temperatures at which such integrated injection logic gate is operated, and wherein said integrated injection logic gate serving as said first intermediate signal level inverter is so constructed that a current value can be selected for current applied to a current injection input thereof such that its said intermediate switching delay will be independent of temperatures at which such integrated injection logic gate is operated.

12. The apparatus of claim 9 wherien each of said integrated injection logic gates serving as one of said plurality of multiple output signal level inverters is so constructed that a current value can be selected for current applied to a current injection input thereof such that its said first and second switching delays will be independent of temperatures at which such integrated injection logic gate is operated, and wherein each said integrated injection logic gate serving as one of said set of intermediate signal level inverters is so constructed that a current value can be selected for current applied to a current injection input thereof such that its said intermediate switching delay will be independent of temperatures at which such integrated injection logic gate is operated.

* * * * *